May 26, 1970 O. R. BALCOM, JR 3,514,634

CIRCUIT FOR CONVERTING VOLTAGE TO TIME

Filed Oct. 2, 1967

INVENTOR

Orville R. Balcom, Jr.

BY Henry [signature]

ATTORNEY 3,514,634
CIRCUIT FOR CONVERTING VOLTAGE TO TIME

Orville R. Balcom, Jr., San Pedro, Calif., assignor to the United States of America as represented by the Secretary of the Air Force Filed Oct. 2, 1967, Ser. No. 672,387
Int. Cl. H03k *5/20*
U.S. Cl. 307—235 4 Claims

ABSTRACT OF THE DISCLOSURE

A voltage ramp generator supplies a negative-going ramp voltage through a switching network to a zero crossing detector which supplies a pulse to the switch network when the ramp voltage crosses through zero. Upon receipt of the pulse, the switching network starts a counter and also adds the analog input voltage to the ramp voltage. When the input to the zero crossing detector again crosses zero, another pulse is fed to the switching network which then stops the counter. The output of the counter is a representation of the analog input voltage.

BACKGROUND OF THE INVENTION

The present invention pertains generally to an improvement in converters and more particularly to the elimination of errors in voltage ramp type analog voltage to time converters. Various attempts have been made to increase the accuracy of converters. Heretofore, these attempts have been primarily directed toward the constructing of more accurate components to be used in the converters. Also, it has been attempted to add components to the converter in order to compensate for and eliminate errors that occur. The present invention involves a different approach, that of reducing the number of components in the converter thereby reducing the number of sources of errors.

Prior art voltage ramp type converters employ two zero crossing detectors. One of the detectors was used to sense when the ramp voltage was equal to the analog input voltage and at this time start the counter. The other detector was used to sense when the ramp voltage was equal to some reference—usually zero—and at this time stop the counter. It can be seen that any unbalance as to the two detectors would be observed as error in the digital output reading, and this error would be independent of any input to the detectors.

BRIEF SUMMARY OF THE INVENTION

In the voltage ramp converter of the present invention, a voltage ramp generator feeds a negative-going ramp voltage into a switching network through which it is fed into a zero crossing detector. As this ramp voltage crosses zero, the detector provides an output to the switching network which superimposes the analog input voltage to be measured on the ramp voltage and, at the same time, starts a counter. The input to the detector will now exceed the reference voltage by the amount of the analog input voltage and decrease toward zero at a rate predetermined by the ramp generator. As the voltage ramp continues to progress in a negative direction, the detector input will again cross through zero providing another output from the zero crossing detector which is used to trigger the switching network to stop the counter. The time during which the counter operates is proportional to the analog input voltage, and the count accumulated thereby is a digital representation of the analog input voltage. Since only one zero crossover detector is used in this converter, there can be no error due to any unbalance between two detectors, and the digital output reading is proportional only to the analog input voltage to the detectors.

Therefore, the objects of this invention are to provide an improved analog voltage to time converter having increased accuracy, to provide a voltage ramp converter using only one zero crossover detector, and to provide a converter wherein the output reading will not be effected by any unbalance between two zero crossover detectors.

BRIEF DESCRIPTION OF THE DRAWINGS

The features of the invention are better understood from the following description of the preferred embodiment taken in conjunction with the accompanying drawings in which.

DESCRIPTION OF THE PREFERRED EMBODIMENT

Figure 1:
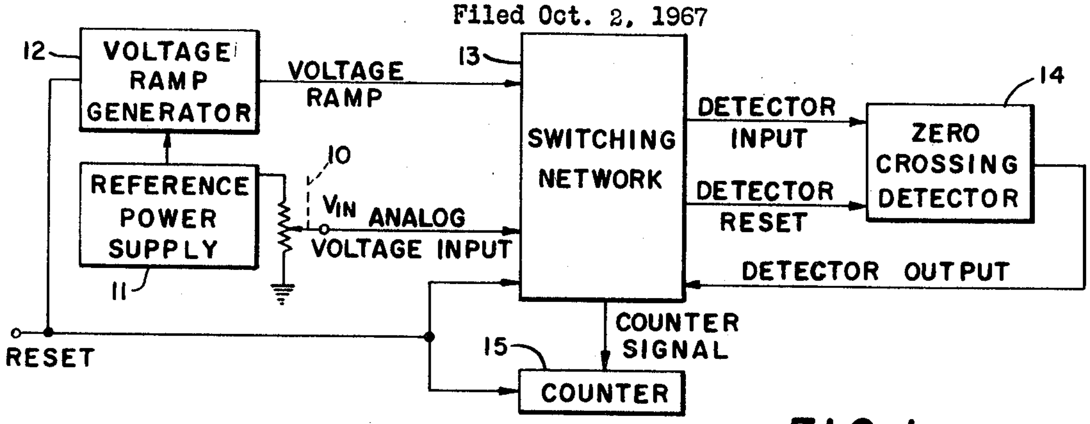
FIG. 1 is a block diagram of a voltage ramp analog to digital converter according to the invention.

Referring now to FIG. 1, the basic converter of the present invention comprises a voltage ramp generator 12, switching network 13, zero crossing detector 14, and counter 15. A reference power supply 11 is used to provide a reference voltage to analog voltage input circuits 10 and to voltage ramp generator 12. Reset circuits (not shown) provide a signal which resets voltage ramp generator 12, switching network 13, and counter 15 to their initial state and may consist of any unit which will furnish a pulse upon initiation by the operator.

At the receipt of a reset signal, counter 15 is set to zero, the voltage ramp generator 12 initiates a positive voltage having a negative-going voltage ramp that is fed to the switching network 13, and the switching network 13 is set in a state that allows the negative-going voltage ramp to be applied to the zero crossing detector 14. As the negative-going voltage ramp crosses zero, the zero crossing detector 14 provides an output signal to the switching network 13. Upon the receipt of this signal, the switching network 13 emits a counter signal to start counter 15, adds the analog voltage input $V_{in}$ to the previously generated ramp voltage (which at that instant is equal to zero and progressing in a negative direction), and resets the zero crossing detector 14. The input to the zero crossing detector 14 will now be positive by the amount of the analog voltage input $V_{in}$ and will progress in a negative direction. As the input to detector 14 again crosses zero, an output signal will be provided by detector 14 to switching network 13. Upon receipt of this signal, switching network 13 emits a counter signal which stops counter 15. It is evident that the time for which the counter 15 was operating is proportional to the analog voltage input $V_{in}$ and the count accumulated is a digital representation of the analog output.

Voltage ramp generator 12, zero crossing detector 14, and counter 15 may be any known in the art provided they perform the functions stated. Included in the types of counters which may be used in this invention are devices which give a direct numerical digital reading proportional to the time of their operation. Another type of counter which may be used includes a clock mechanism and a pulse generator which converts the length of time for which the counter receives the counter signal into a pulsed binary coded output.

Figures 2, 3:
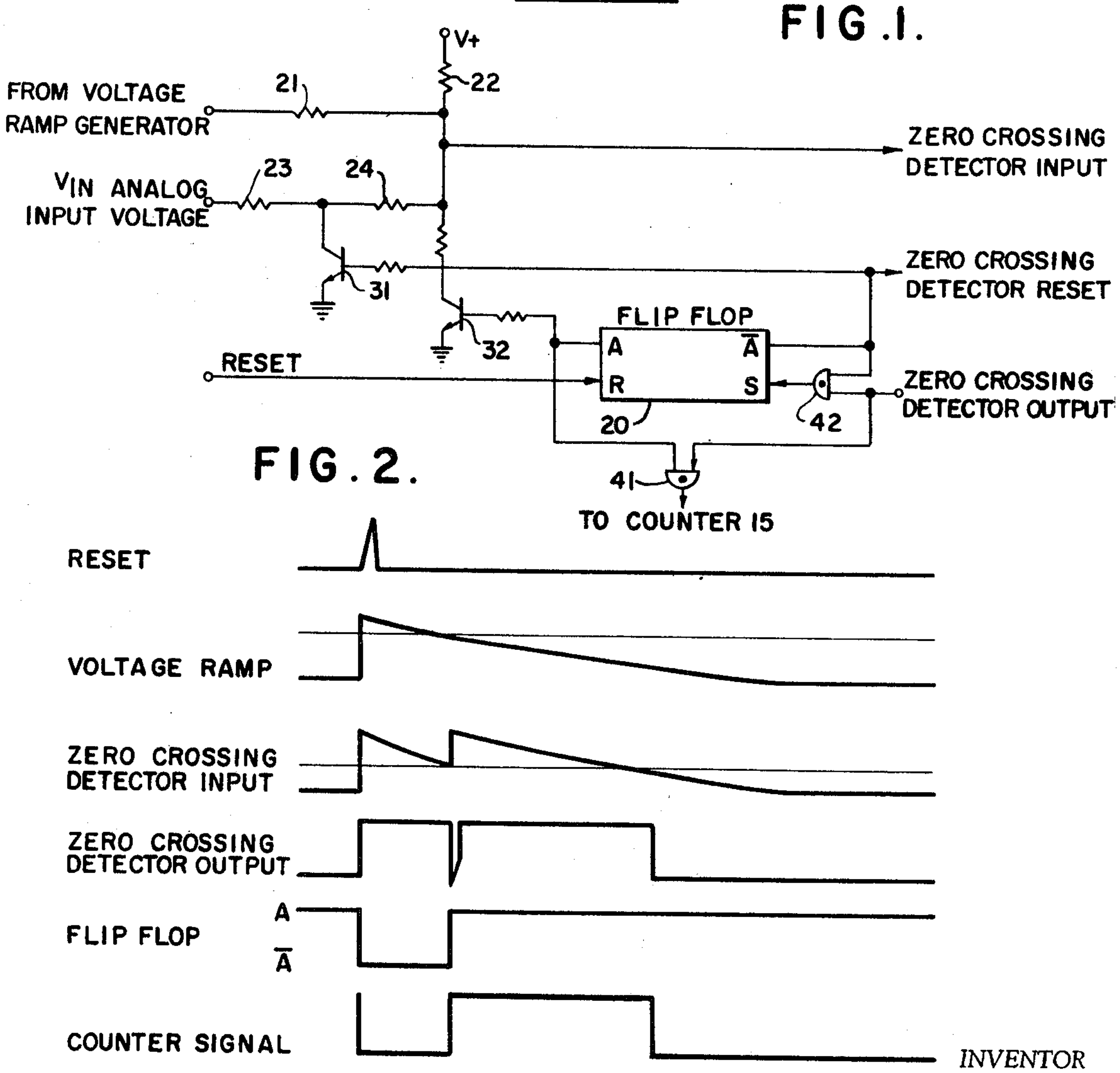
FIG. 2 is a schematic diagram of a preferred embodiment for the switching network to be used in the invention.
FIG. 3 is a graph of the various voltage signals during a cycle.

Various types of switching networks may be used within the scope of the invention, however, a preferred embodiment is shown in FIG. 2 and its operation will now be described in detail in conjunction with the graph of voltage signals during a cycle shown in FIG. 3.

At the receipt of a reset pulse at input R flip flop 20 is set to its $\bar{A}$ state. This causes transistor 31 to conduct shorting the analog input voltage V*in* to ground through resistor 23. The zero crossing detector input will then be the sum of the current through resistors 21 and 22 which will be a voltage ramp starting positive and progressing toward zero. As this voltage ramp crosses zero, the detector 14 provides an output through AND gate 42 to input S of flip flop 20 and to AND gate 41. As a result, flip flop 20 is changed to the A condition thereby causing transistor 31 to stop conducting, transistor 32 to conduct, zero crossing detector 14 to be reset, and counter 15 to be started through AND gate 41. Since transistor 31 is not conducting, a current proportional to the analog input voltage V*in* is generated by resistors 23 and 24 and is added to the ramp voltage to provide an input signal to zero crossing detector 14 positive in sign and with a magnitude proportional to the analog input. As the combined signal to the zero crossing detector 14 progresses negatively, another zero crossing will be sensed providing another output to gates 41 and 42. The effect of this signal is to stop the counter 15.

It is obvious that various modifications may be made that fall within the scope of the invention. For example, the analog input voltage could be a negative quantity and the voltage ramp generator could supply a negative voltage with a positive going ramp. Also, the detector 14 could be set to supply an output pulse upon the input crossing a voltage other than zero. Therefore, because modifications may be made which fall within the scope of the invention, the inventor intends to be limited only to a broad interpretation of the appended claims.

What is claimed is:

1. A voltage measuring and conversion circuit for measuring an unknown analog voltage comprising: generating means having an output voltage ramp which varies linearly with time, a detector having an input and an output and having the characteristic of producing a signal on its output when its input is at a given voltage, a switching network means connected to the output of said generating means and to the input and output of said detector, said switching network means coupling said output voltage ramp to the input of said detector, and said switching network means including a means for adding the unknown analog voltage to said voltage ramp upon receiving a signal from the output of said detector.

2. A voltage measuring and conversion circuit according to claim 1 including a counter having an input connected to said switching network means and wherein said switching network means transmits a signal to said counter upon receipt of a signal from the output of said detector.

3. A voltage measuring and conversion circuit according to claim 1 wherein said switching network means includes a flip flop connected to receive the output from said detector and connected to said adding means to thereby control the input to said detector, said flip flop in a first state allowing only the output voltage ramp to be fed to the input of said detector, and said flip flop in a second state allowing the sum of the voltage ramp and unknown analog voltage to be fed to the input of said detector.

4. A voltage measuring and conversion circuit according to claim 3 including a counter having an input connected to said switching network means and wherein said switching network means transmits a signal to said counter upon receipt of a signal from the output of said dectector.

References Cited

UNITED STATES PATENTS

| | | | |
|---|---|---|---|
| 2,858,438 | 10/1958 | Merrill | 307—235 XR |
| 3,351,873 | 11/1967 | Kimura | 307—235 XR |

JOHN S. HEYMAN, Primary Examiner

J. ZAZWORSKY, Assistant Examiner

U.S. Cl. X.R.

307—228, 265; 328—115, 150